United States Patent [19]

Benge et al.

[11] Patent Number: 4,717,438
[45] Date of Patent: Jan. 5, 1988

[54] METHOD OF MAKING TAGS

[75] Inventors: S. Eugene Benge, Middletown; Robert L. Froning, Kettering, both of Ohio

[73] Assignee: Monarch Marking Systems, Inc., Dayton, Ohio

[21] Appl. No.: 912,466

[22] Filed: Sep. 29, 1986

[51] Int. Cl.⁴ .............................................. B32B 31/18
[52] U.S. Cl. ..................................... 156/152; 156/248;
156/249; 156/267; 156/289; 29/592 R; 29/602 R; 333/175; 333/185; 361/402
[58] Field of Search ............... 156/248, 249, 267, 289, 156/299, 301, 152; 29/25.42, 592 R, 592 E, 602 R; 333/138, 140, 175, 185; 336/69, 200, 205, 232; 361/402; 340/572

[56] References Cited

U.S. PATENT DOCUMENTS

| 3,240,647 | 3/1966 | Morgan | 156/249 |
| 3,624,631 | 11/1971 | Chomet et al. | 340/572 |
| 3,810,147 | 5/1974 | Lichtblau | 340/572 |
| 3,913,219 | 10/1975 | Lichtblau | 29/592 |
| 4,369,557 | 1/1983 | Vandebult | 361/402 |
| 4,482,874 | 11/1984 | Rubertus et al. | 333/185 |
| 4,555,291 | 11/1985 | Tait et al. | 156/267 |
| 4,567,473 | 1/1986 | Lichtblau | 340/572 |
| 4,578,654 | 3/1986 | Tait | 333/175 |
| 4,591,814 | 5/1986 | Ito et al. | 29/592 R |

FOREIGN PATENT DOCUMENTS 2412923 1/1979 France .

Primary Examiner—Caleb Weston
Attorney, Agent, or Firm—Joseph J. Grass

[57] ABSTRACT

This invention relates to a tag useable with an electronic article surveillance system and comprised of planar conductive material cut into a pair of inverse, first and second spiral conductors wrapped about each other and positioned for capacitive and inductive coupling. The invention also relates to method of making tags wherein conductors are cut from a planar web of conductive material in a continuous process in a manner that the cutting results in the formation of two spiral conductors without accompanying waste of conductive material, and thereafter positioning the conductors to provide resonant circuits.

9 Claims, 10 Drawing Figures

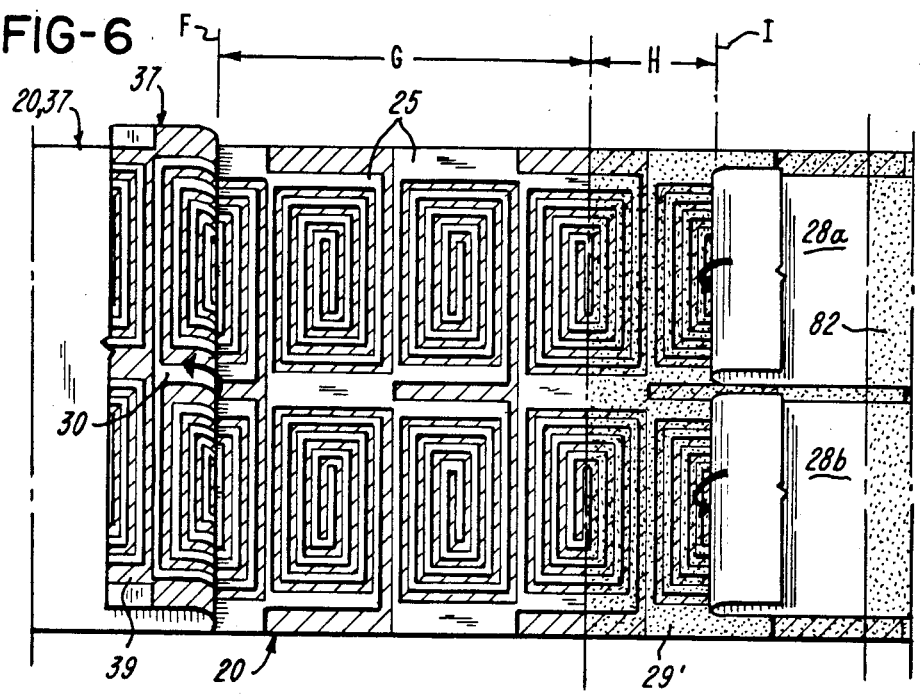
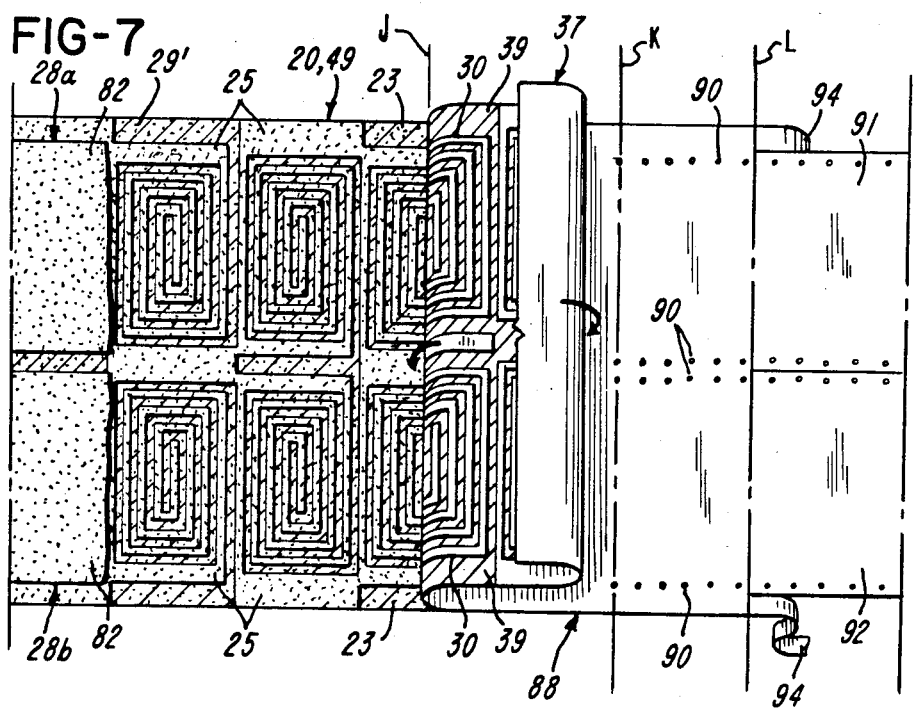

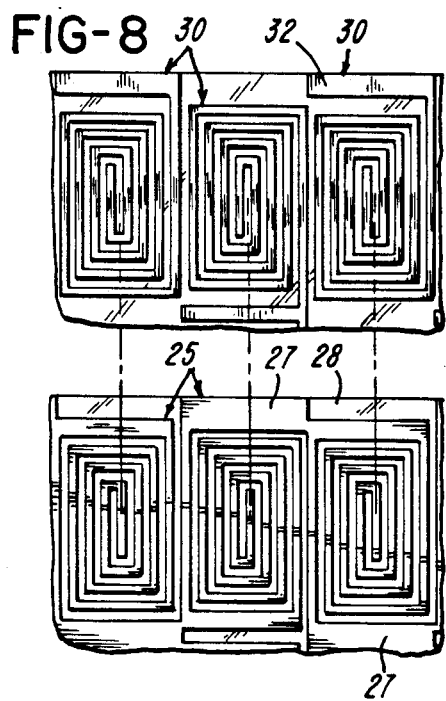
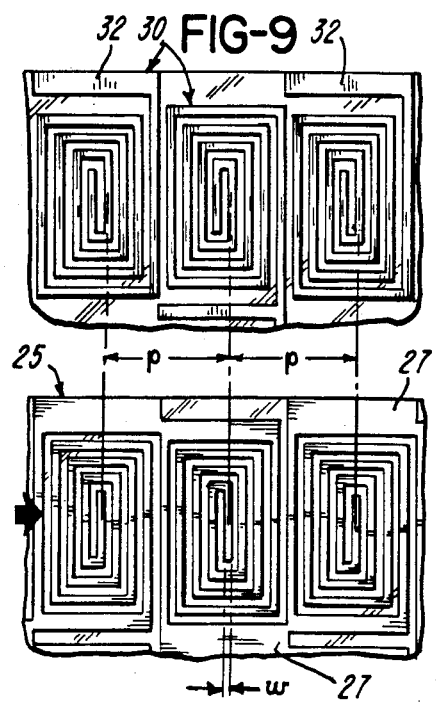
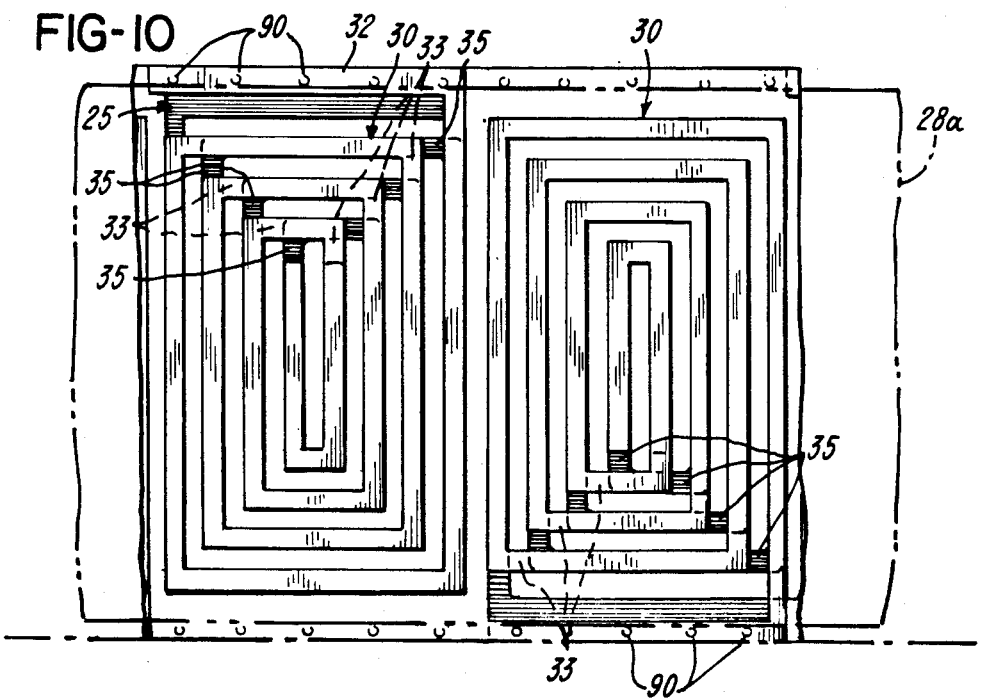

4,717,438

METHOD OF MAKING TAGS

BACKGROUND OF THE INVENTION

1. Field of the Invention

This invention relates to the art of resonant tags used in electronic article surveillance systems and to method of making such tags.

2. Brief Description of the Prior Art

The following U.S. Pat. Nos. are made of record: 4,482,874 to Rubertus et al granted Nov. 13, 1984 and 4,555,291 to Tait et al granted Nov. 26, 1985.

SUMMARY OF THE INVENTION

This invention relates to a method of making tags each having a resonant circuit for use in an electronic article surveillance system. This method has as one object the mass production on a continuous basis of such tags wherein there is virtually no waste of the materials of construction. The method of the invention avoids the need for chemical etching and plating used in certain prior art methods.

According to a specific embodiment of the method of the invention, a web of conductive material is cut into a pair of inverse spiral conductors disposed in contiguous relation and wound about each other, thereafter while in a first web the first conductors are separated from the second conductors which are supported in a second web, thereafter the first conductors and the second conductors are positioned into pairs of first and second conductors capable of being in capacitive and inductive coupled relationship, and thereafter connecting each pair of such conductors to provide tags each having a resonant circuit.

According to a specific embodiment of the tag according to the invention, there is a generally planar dielectric inverse first and second spiral conductors in capacitively and inductively coupled relationship on opposite sides of the dielectric, means for electrically connecting the first and second conductors to provide a resonant circuit, wherein the first and second conductors are formed by cutting conductive planar material spirally to provide pairs of first and second inverse conductors, and positioning a pair of the first and second conductors in said relationship. It is preferred to make the tags in a longitudinal series and preferably with a plurality of laterally extending tags.

BRIEF DESCRIPTION OF THE DRAWINGS

FIG. 6 is a diagrammatic top plan view showing the first coated web with the first conductors adhered thereto being separated relative to the second coated web with the second conductors adhered thereto, and showing further the first coated web having been recoated with adhesive and two webs of dielectric being laminated to the recoated first coated web, and showing the dielectric webs having been coated with adhesive;

FIG. 7 is a diagrammatic top plan view showing the second coated web with the second conductors adhered thereto having been shifted and laminated over and to the dielectric webs and to the first coated web with the first conductors to provide a composite tag web, showing the staking of the first and second conductors of each tag to provide resonant circuits for each tag, and showing slitting of the composite tag web to provide a plural series of composite tag webs;

FIG. 8 is a vertically exploded view showing the first and second coated webs with the first and second conductors that result from cutting the electrically conductive web spirally;

FIG. 9 is a top plan view showing the first and second coated webs shifted by a distance equal to the width of one conductor spiral plus the width of one conductor; and FIG. 10 is a top plan view of two tags with the dielectric web shown in phantom lines.

DESCRIPTION OF THE PREFERRED EMBODIMENTS

Figure 1:
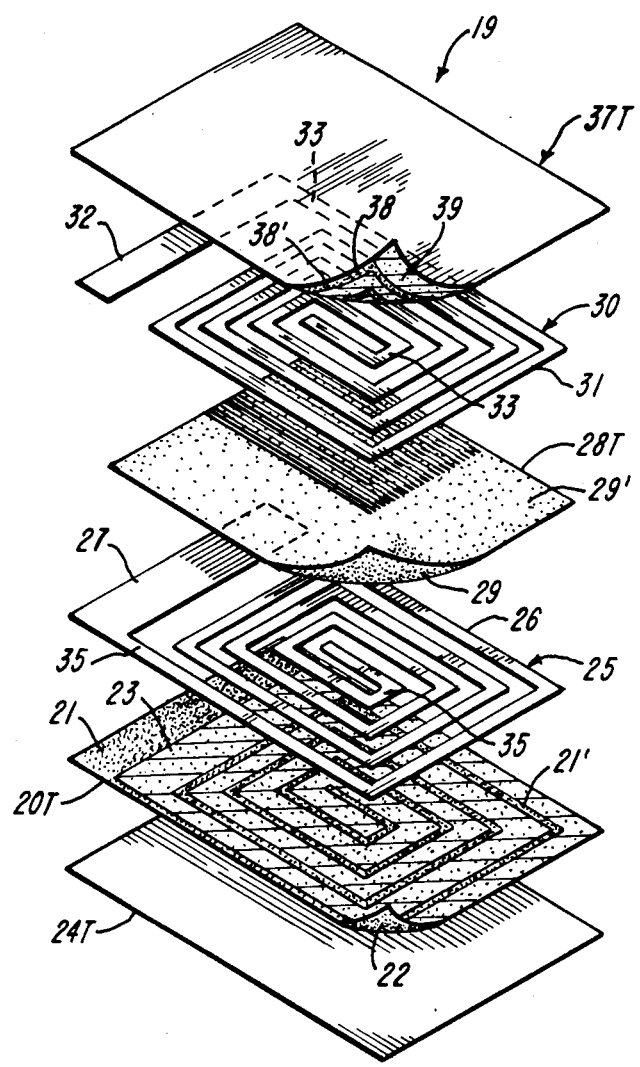
FIG. 1 is an exploded perspective view of a tag in accordance with an embodiment of the invention.

Referring initially to FIG. 1, there is shown an exploded view of a tag generally indicated at 19. The tag 19 is shown to include a sheet 20T having pressure sensitive adhesive 21 and 22 on opposite faces thereof. A mask 23 in a spiral pattern covers a portion of the adhesive 21 and a release sheet 24T is releasably adhered to the adhesive 22. The mask 23 renders the adhesive 21 which it covers non-tacky or substantially so. A conductor spiral indicated generally at 25 includes a spiral conductor 26 having a number of turns. The conductor 26 is of substantially the same width throughout its length except for a connector bar 27 at the outer end portion of the conductor spiral 26. There is a sheet of dielectric 28T over and adhered to the conductor spiral 25 and the underlying sheet 20T by means of adhesive 29. A conductor spiral generally indicated at 30 includes a spiral conductor 31 having a number of turns. The conductor 31 is adhered to adhesive 29' on the dialectric 28T. The conductor 31 is substantially the same width throughout its length except for a connector bar 32 at the outer end portion of the conductor spiral 30. The conductor spirals 25 and 30 are generally aligned in face-to-face relationship except for portions 33 which are not face-to-face with the conductor 26 and except for portions 35 which are not face-to-face with the conductor 31. A sheet 37T has a coating of a pressure sensitive adhesive 38 masked off in a spiral pattern 39. The exposed adhesive 38' is aligned with the conductor spiral 30. Adhesive is shown in FIG. 1 by heavy stippling and the masking is shown in FIG. 1 by light stippling with cross-hatching. The connector bars 27 and 32 are electrically connected, as for example by staking 90. It should be noted that the staking 90 occurs where connector bars 27 are separated only by adhesive 29. There is no paper, film or the like between the connector bars 27 and 32. Accordingly, the staking disclosed in the present application is reliable.

Figure 2:
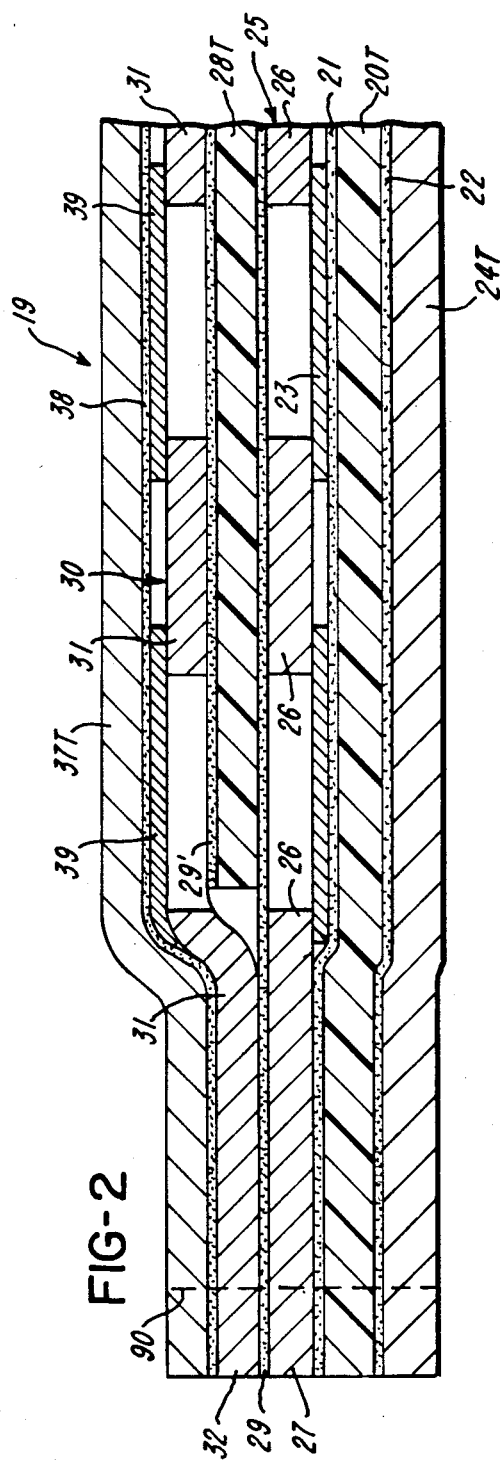
FIG. 2 is a fragmentary sectional view of the tag shown in FIG. 1.
Figure 3:
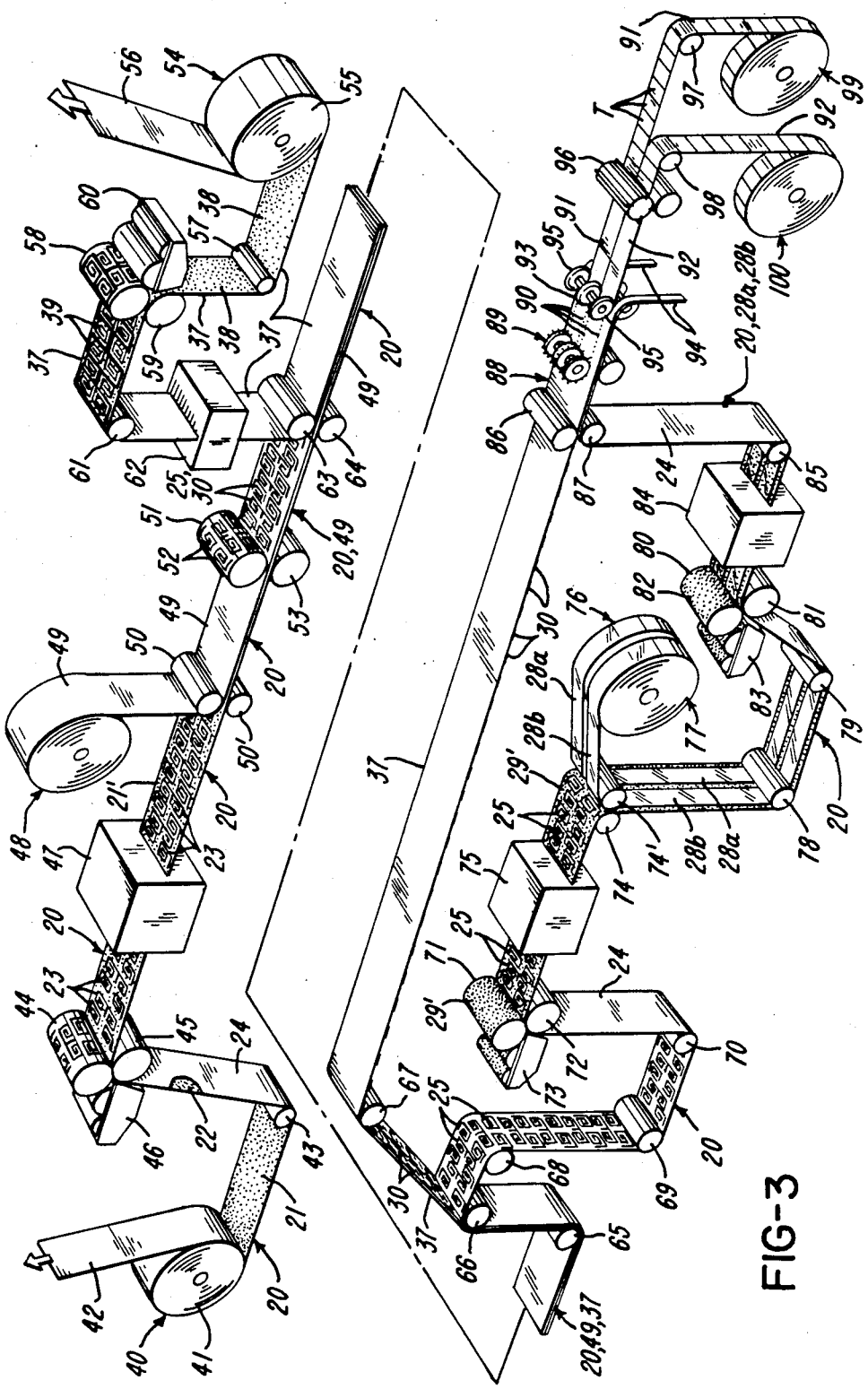
FIG. 3 is a diagrammatic perspective view illustrating method of making a tag in accordance with the invention.
Figure 4:
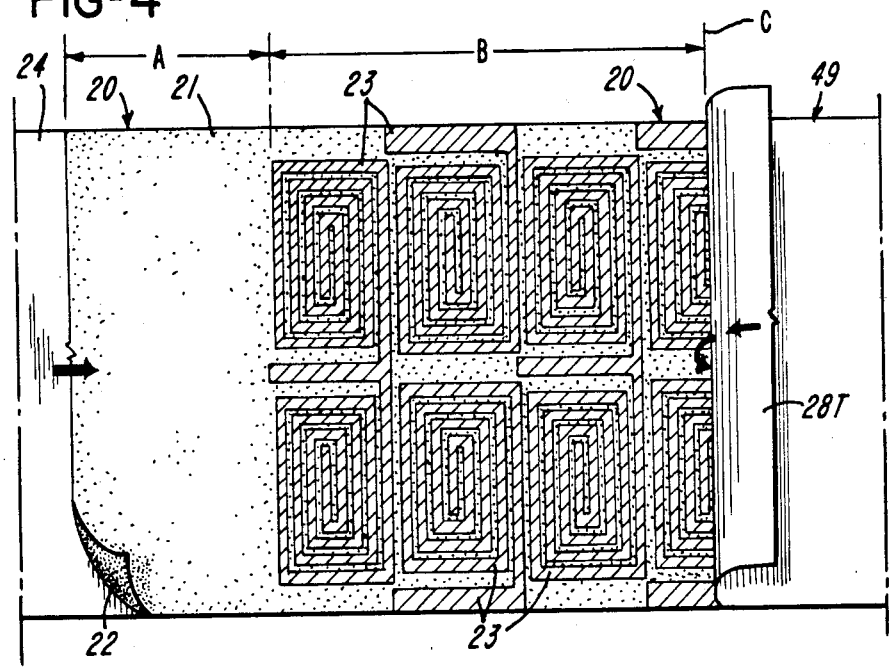
FIG. 4 is a diagrammatic top plan view showing a mask having been applied to a first adhesive coated web and showing an electrically conductive web being laminated to the masked first adhesive coated web.
Figure 5:
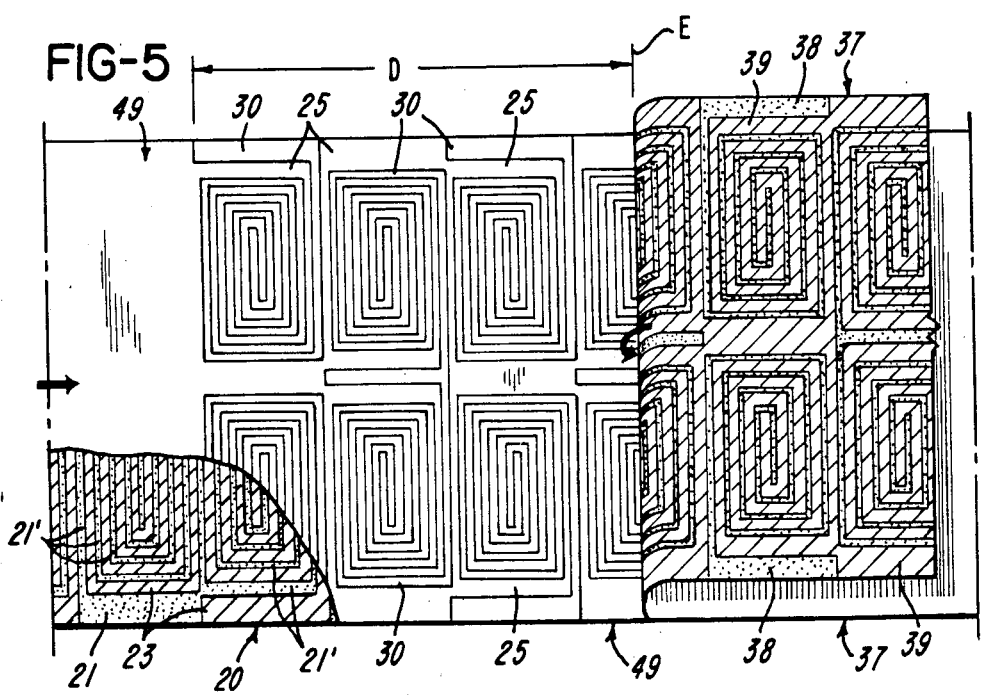
FIG. 5 is a diagrammatic top plan view showing the conductive web having been cut to provide first and second pairs of conductors and showing a masked second adhesive coated web being laminated to the conductive web.

With reference to FIG. 3, there is shown diagrammatically a method for making the tag 19 shown in FIGS. 1 and 2. A roll 40 is shown to be comprised of a composite web 41 having a web 20 with a full-gum or continuous coatings of pressure sensitive adhesive 21 and 22 on opposite faces thereof. The web 20 is "double-faced" with adhesive. A release liner or web 42 is releasably adhered to the upper side of the web 20 by the pressure sensitive adhesive 21, and the underside of the web 20 has a release liner or web 24 releasably adhered to the pressure sensitive adhesive 22. As shown, the release liner 42 is delaminated from the web 20 to expose the adhesive 21. The adhesive coated web 20 together with the release liner 24 pass partially about a sandpaper roll 43 and between a pattern roll 44 and a back-up roll 45 where mask patterns 23 are applied onto the adhesive 21 to provide longitudinally recurring adhesive patterns 21'. Masking material from a fountain 46 is applied to the pattern roll 44. With reference to FIG. 4, the portion marked A represents the portion of the web 20 immediately upstream of the pattern roll 44. The portion marked B shows the mask patterns 23 printed by the roll 44. The patterns 23 are represented by cross-hatching in FIG. 4. With reference to FIG. 3, the web 20 now passes through a dryer 47 where the mask patterns 23 are dried or cured. The adhesive 21 is rendered non-tacky at the mask patterns 23. A web 49 of planar, electrically conductive material such as copper or aluminum from a roll 48 is laminated onto the coated web 20 as they pass between laminating rolls 50 and 50'. Reference character C in FIG. 4 denotes the line where lamination of the webs 20 and 49 occurs. With reference to FIG. 3, the laminated webs 21 and 49 now pass between a cutting roll 51 having cutting blades 52 and a back-up roll 53. The blades 52 cut completely through the conductive material web 49 but preferably do not cut into the web 20. The blades 52 cut the web 49 into a plurality of series of patterns 25 and 30 best shown in the portion marked D in FIG. 5. With reference again to FIG. 3, there is shown a roll 54 comprised of a composite web 55 having a web 37 with a full-gum or continuous coating of pressure sensitive adhesive 38 and a release liner 56 releasably adhered to the adhesive 38 on the web 37. The release liner 56 is separated from the web 37 and the web 37 passes about a sandpaper roll 57. From there the web 37 passes between a pattern roll 58 and a back-up roll 59 where mask patterns 39 are applied onto the adhesive 38 to render the adhesive 21 non-tacky at the mask patterns 39 to provide longitudinally recurring adhesive patterns 38' (FIG. 1). Masking material from a fountain 60 is applied to the pattern roll 58. The masking material of which the patterns 23 and 39 are comprised is a commercially available printable adhesive deadener such as sold under the name "Aqua Superadhesive Deadener by Environmental Inks and Coating Corp, Morganton, N.C. From there the web 37 passes partially about a roll 61 and through a dryer 62 where the mask patterns 39 are dried or cured. The adhesive 38 is rendered non-tacky at the mask patterns 39. From there the webs 20, 49 and 37 pass between laminating rolls 63 and 64. FIG. 5 shows that lamination occurs along line E where the web 37 meets the web 49. When thus laminated, each adhesive pattern 21' registers only with an overlying conductor spiral 25 and each adhesive pattern 38' registers only with an underlying conductor spiral 30.

The webs 20, 37 and 49 pass successively partially about rolls 65 and 66 and from there the web 37 delaminates from the web 20 and passes partially about a roll 67. At the place of delamination, the web 49 separates into two webs of conductor spirals 25 and 30. As shown in FIG. 6, delamination occurs along the line marked F. When delamination occurs, the conductor spirals 30 adhere to the adhesive patterns 38' on the web 37, and the conductor spirals 25 adhere to the adhesive patterns 21' on the web 20. Thus, the conductor spirals 30 extend in one web and the spirals 25 extend in another web. The web 20 passes partially about rolls 68, 69 and 70 and from there pass between an adhesive coating roll 71 and a back-up roll 72. Adhesive 29' from a fountain 73 is applied to the roll 71 which in turn applies a uniform or continuous coating of adhesive 29' to the web 20 and over conductive spirals 25. The portion marked G in FIG. 6 shows the portion of the web 20 and conductor spirals 25 between the spaced rolls 66 and 72. The portion marked H shows the portion of the web 20 between the spaced rolls 72 and 74. With reference to FIG. 3, the web 20 passes through a dryer 75 where the adhesive 29' is dried. A plurality, specifically two laterally spaced dielectric webs 28a and 28b wound in rolls 76 and 77 are laminated to the web 20 as the webs 20, 28a and 28b pass between the rolls 74 and 74'. This laminating occurs along reference line I indicated in FIG. 6. With reference to FIG. 3, the web 20 with the conductor spirals 25 and the dielectric webs 28a and 28b pass about rolls 78 and 79 and pass between an adhesive applicator roll 80 and a back-up roll 81. The roll 80 applies adhesive 82 received from a fountain 83 to the webs 28a and 28b and to the portions of the web 20 not covered thereby. From there, the webs 20, 28a and 28b pass through a dryer 84 and partially about a roll 85.

The web 37 which had been separated from the web 20 is laminated at the nip of laminating rolls 86 and 87 along a line marked J in FIG. 7 to provide a composite tag web generally indicated at 88. The webs 20, 28a, 28b and 37 are laminated between rolls 86 and 87 after the conductor spirals 30 have been shifted longiutudinally with respect to the conductor spirals 25 so that each conductor spiral 30 is aligned or registered with an underlying conductor spiral 25. The shifting can be equal to the pitch of one conductor spiral pattern as indicated at p (FIG. 9) plus the width w of one conductor, or by multiples of the pitch p plus the width w of one conductor. Thus, each pair of conductor spirals 25 and 30 is capable of making a resonant circuit detectable by an appropriate article surveillance circuit.

FIG. 8 shows the web 20 and the web 37 rotated apart by 180°. FIG. 9 shows the web 20 and the web 37 rotated apart by 180° and as having been shifted with respect to each other so that the conductor spirals 25 and 30 are aligned. As best shown in FIG. 10, the dielectric 28a terminates short of stakes 90 resulting from the staking operation. By this arrangement the stakes 90 do not pass through the dielectric 28a (or 28b). FIG. 10 shows the conductor spirals 25 and 30 substantially entirely overlapped or aligned with each other, except as indicated at 35 for the conductor spiral 25 and as indicated at 33 for the conductor spiral 30. Each circuit is completed by staking the conductor bars 27 and 32 to each other as indicated at 90 or by other suitable means. The staking 90 is performed by four spiked wheels 89 which make four stake lines 90 in the composite web 88. The spiked wheels 89 pierce through the conductor bars 27 and 32 and thus bring the conductor bars 27 and 32 into electrically coupled relationship. The web composite 88 is slit into a plurality of narrow webs 91 and 92 by slitter knife 93 and excess material 94 is trimmed by slitter knives 95. The webs 91 and 92 are next cut through up to but not into the release liner 24 by knives on a cutter roll 96, unless it is desired to cut the tags T into separated tags in which event the web 88 is completely severed transversely. As shown, the webs 91 and 92 continue on and pass about respective rolls 97 and 98 and are wound into rolls 99 and 100. As shown in FIG. 7, the staking 90 takes place along a line marked K and the slitting takes place along a line marked L.

The sheet 37T, the dielectric 28T, the sheet 20T and the sheet 24T are respectively provided by cutting the web 37, the web 28a (or 28b), the web 20 and the web 24.

Other embodiments and modifications of the invention will suggest themselves to those skilled in the art, and all such of these as cost within the spirit of this invention are included within its scope as best defined by the appended claims.

We claim:

1. Method of making tags for use in an electric article surveillance system, comprising the steps of: providing a first web having a series of longitudinally recurring first patterns of adhesive, providing a second web having a series of longitudinally recurring second patterns of adhesive, cutting a web of conductive material to form longitudinally recurring pairs of first and second contiguous, coplanar, spiral conductors wrapped about each other, the first and second webs being positioned on opposite sides of the conductive material web with the first adhesive patterns in contact with only the first conductors and with the second adhesive patterns in contact with only the second conductors, separating the first web with the first conductors adhered thereto and the second web with the second conductors adhered thereto from each other, thereafter positioning the first and second conductors into a related arrangement for capacitive and inductive coupling, and connecting the related first and second conductors to provide a composite tag web of a series of tags each having a resonant circuit.

2. Method as defined in claim 1, wherein the step of providing a first web having the recurring first adhesive patterns includes the step of applying to an adhesive-coated first carrier web a series of longitudinally recurring patterns of masking material which prevent the second conductors from adhering to the first carrier web, and wherein the step of providing a second web having the recurring second adhesive patterns includes the step of applying to an adhesive-coated second carrier web a series of longitudinally recurring second patterns of masking material which prevent the first conductors from adhering to the second carrier web.

3. Method as defined in claim 1, wherein the step of positioning the first and second webs includes the step of bringing a web of dielectric material between the first conductors on the first web and the second conductors on the second web.

4. Method as defined in claim 2, including the step of bringing a web of dielectric material between the first conductors on the first web and the second conductors on the second web.

5. Method as defined in claim 1, wherein there are a plurality of said resonant circuits formed laterally across the composite web, and slitting the composite tag web longitudinally to provide a plurality of series of tags.

6. Method of making tags for use in an electric article surveillance system, comprising the steps of: providing a longitudinally extending web of conductive material, cutting the web of conductive material to form a plurality of sets of conductors with each set having contiguous, coplanar, first and second spiral conductors wrapped about each other, supporting the first spiral conductors in a first longitudinally extending conductor web, supporting the second spiral conductor in a second longitudinally extending conductor web, separating the first spiral conductor web and the second spiral conductor web from each other, shifting the first spiral conductor web and the second spiral conductor web longitudinaly relative to each other to bring the first spiral conductors and the second spiral conductors into related arrangement for capacitive and inductive coupling, and connecting the related first and second conductors to provide a series of tags each having a resonant circuit.

7. Method as defined in claim 6, wherein the shifting step includes shifting the first spiral conductor web and the second spiral conductor web relative to each other by a distance equal to the longitudinal pitch of the first conductors plus the width of the first conductors or to any multiple thereof.

8. Method of making tags for use in an electronic article surveillance system, comprising the steps of: providing a first composite web including a first web having a full-gum coating of pressure-sensitive-adhesive and a release-coated first backing web, stripping the first backing web from the first coated web, applying a first masking pattern to the adhesive on the first coated web, drying the first masking pattern, laminating a web of conductive material onto the first coated web and against the unmasked adhesive on the first coated web, cutting the conductive material web to form longitudinally recurring pairs of first and second contiguous, coplanar, spiral conductors wrapped about each other and so that the first conductors are adhered to the unmasked adhesive on the first coated web, providing a second composite web including a second coated web having a full-gum coating of pressure-sensitive adhesive and a release coated second backing web, stripping the second backing web from the second coated web, applying a second masking pattern to the second coated web, drying the second masking pattern, laminating the second coated web to the conductive material web, with the unmasked adhesive on the second coated web registered with the second conductors, delaminating the first coated web with the first conductors adhered thereto and the second coated web with the second conductors adhered thereto from each other, applying adhesive to the first coated web, drying the adhesive applied to the recoated first coated web, laminating a web of dielectric material onto the recoated first coated web, applying adhesive to the dielectric material web, drying the adhesive on the dielectric material web, laminating the first and second coated webs to each other with the web of dielectric material therebetween to provide a composite tag web, wherein the laminating step includes shifting the first and second coated webs longitudinally to bring the first and second conductors into a related arrangement for capacitive and inductive coupling, and staking the related first and second conductors to provide a series of connected tags each having a resonant circuit.

9. Method as defined in claim 8, wherein there are a pluality of said resonant circuits found laterally across the composite tag web, and slitting the composite tag web longitudinally to provide a plurality of series of tags.

* * * * *

UNITED STATES PATENT AND TRADEMARK OFFICE
CERTIFICATE OF CORRECTION

PATENT NO. : 4,717,438

DATED : January 5, 1988

INVENTOR(S) : S. Eugene Benge and Robert L. Froning

It is certified that error appears in the above-identified patent and that said Letters Patent are hereby corrected as shown below:

Column 1, line 26, after "while" --supported-- has been omitted. Column 5, line 14, "cost" should be --come--.

Signed and Sealed this

Twenty-first Day of March, 1989

Attest:

Attesting Officer

DONALD J. QUIGG

Commissioner of Patents and Trademarks

UNITED STATES PATENT AND TRADEMARK OFFICE
CERTIFICATE OF CORRECTION

PATENT NO. : 4,717,438

DATED : January 5, 1988

INVENTOR(S) : S. Eugene Benge and Robert L. Froning

It is certified that error appears in the above-identified patent and that said Letters Patent is hereby corrected as shown below:

Column 6, line 5, "conductor" should be --conductors--.

Signed and Sealed this

Fourth Day of September, 1990

Attest:

HARRY F. MANBECK, JR.

Attesting Officer

Commissioner of Patents and Trademarks